(12) United States Patent
Burns

(10) Patent No.: US 7,679,205 B1
(45) Date of Patent: Mar. 16, 2010

(54) METHOD AND APPARATUS FOR CONVERTING ENERGY TO ELECTRICITY

(76) Inventor: Phillip Burns, 908 NW. 30th Ct., Wilton Manors, FL (US) 33311

( * ) Notice: Subject to any disclaimer, the term of this patent is extended or adjusted under 35 U.S.C. 154(b) by 921 days.

(21) Appl. No.: 11/483,055

(22) Filed: Jul. 7, 2006

Related U.S. Application Data

(63) Continuation of application No. 10/784,086, filed on Feb. 20, 2004, now Pat. No. 7,098,547.

(51) Int. Cl.
*H02N 11/00* (2006.01)
(52) U.S. Cl. .................................. 290/1 R; 310/306
(58) Field of Classification Search ............... 290/4 B
See application file for complete search history.

(56) References Cited

U.S. PATENT DOCUMENTS

| | | | | |
|---|---|---|---|---|
| 476,983 | A * | 6/1892 | Edison | 310/306 |
| 481,999 | A * | 9/1892 | Berliner | 310/306 |
| 2,619,603 | A * | 11/1952 | Chilowsky | 310/306 |
| 3,274,405 | A * | 9/1966 | Swoboda | 310/306 |
| 3,899,696 | A * | 8/1975 | Fletcher et al. | 310/306 |
| 4,323,808 | A * | 4/1982 | Davis | 310/306 |
| 6,660,566 | B2 * | 12/2003 | Masayuki | 438/124 |
| 6,700,472 | B2 * | 3/2004 | Wang et al. | 336/200 |
| 6,725,668 | B1 * | 4/2004 | Cornwall | 62/3.1 |
| 6,849,926 | B2 * | 2/2005 | Park et al. | 257/642 |
| 2002/0160190 | A1* | 10/2002 | Yadav et al. | 428/402 |

FOREIGN PATENT DOCUMENTS

| | | | |
|---|---|---|---|
| EP | 308611 A1 * | 3/1989 | |
| JP | 09274997 A * | 10/1997 | |

* cited by examiner

*Primary Examiner*—Joseph Waks
(74) *Attorney, Agent, or Firm*—Gold & Rizvi, P.A.; Glenn E. Gold; H. John Rizvi

(57) ABSTRACT

A method and apparatus are provided for converting electromagnetic radiation directly into electricity. The method aligns a plurality of ferromagnetic nanocrystals to produce an aggregate magnetic field; utilizes an electrical coil in the aggregate magnetic field; and alternately directs and removes radiant energy from the ferromagnetic nanocrystals such that the aggregate magnetic field decays and regenerates to produce a current in the electrical coil. The apparatus includes either a distribution or a stackup of ferro-magnetic nanocrystals and an electrical coil, the combination of the nanocrystals and the electrical coil operating with energy derived from the source of radiant energy.

3 Claims, 7 Drawing Sheets

US 7,679,205 B1

METHOD AND APPARATUS FOR CONVERTING ENERGY TO ELECTRICITY

CROSS-REFERENCE TO RELATED APPLICATION

This application is a continuation of application Ser. No. 10/784,086 filed on Feb. 20, 2004 now U.S. Pat. No. 7,098,547 issued on Aug. 29, 2006.

BACKGROUND OF THE INVENTION

1. Field of the Invention

The present invention relates generally to the direct conversion of radiant energy into electricity, and more particularly, to a method and apparatus for producing electricity by causing a magnetic field to alternatingly decay and regenerate.

2. Description of the Prior Art

Historically, electricity has been produced by using a generator device to move an electrical coil and a magnetic field relative to one another. Such methods require mechanical moving parts which can wear out or break down and create an interruption in providing electrical power to components.

Various methods have been proposed to directly convert an energy source directly into electricity. U.S. Pat. No. 5,714,829 issued to Gurusprasad, for example, discloses a magnetic mechanical heat engine for converting heat into electricity using electromotive force induced by demagnetization. The heat engine utilizes a magnetic medium which is magnetized by means of a magnetic field produced by an external electrical coil. However, operation of the apparatus disclosed in Gurusprasad '829 requires that the magnetic medium be brought into and out of thermal contact with a heat source, which thus necessitates moving parts and reduces the efficiency of the apparatus.

What is needed is an apparatus for efficiently converting energy directly into electricity.

SUMMARY OF THE INVENTION

The present invention provides a method and an energy conversion device for efficiently converting radiant energy directly into electricity.

In one general aspect of the present invention, a first embodiment comprises a distribution of ferro-magnetic nanocrystals and an electrical coil, the combination operating with energy directed from a radiation source.

In another general aspect of the present invention, a second embodiment comprises two distributions of ferromagnetic nanocrystals, a pair of electrical coils enclosing the ferromagnetic nanocrystals, and a controllable radiation source.

In yet another general aspect of the present invention, a third embodiment comprises a controllable radiation source, a plurality of transparent annular disks alternatingly stacked with a plurality of soft magnetic disks coated with ferromagnetic nanocrystals embedded in a matrix layer, a transparent cylindrical core, and an electrical coil enclosing the stacked annular disks and cylindrical core.

In a further general aspect of the present invention, a method is provided for converting energy from a radiant source into electricity. Initially, a plurality of ferromagnetic nanocrystals are aligned so as to produce an aggregate magnetic field; an electrical conductor is placed into the aggregate magnetic field; and radiant energy is directed onto the plurality of ferromagnetic nanocrystals such that the aggregate magnetic field begins to decay. The radiant energy is then attenuated, allowing the aggregate magnetic field to regenerate, and the process is repeated inducing electric current in the electrical conductor in response to the changing magnetic field.

These and other aspects, features, and advantages of the present invention will become more readily apparent from the attached drawings and the detailed description of the preferred embodiments, which follow.

BRIEF DESCRIPTION OF THE DRAWINGS

The preferred embodiments of the invention will hereinafter be described in conjunction with the appended drawings provided to illustrate and not to limit the invention, where like designations denote like elements, and in which.

DETAILED DESCRIPTION OF THE PREFERRED EMBODIMENTS

Shown throughout the figures, the present invention is generally directed to a method and device for producing electricity. In comparison to other methods known in the art, the method of the present invention provides an elegant and efficient process for directly converting energy into electricity.

Figure 1:
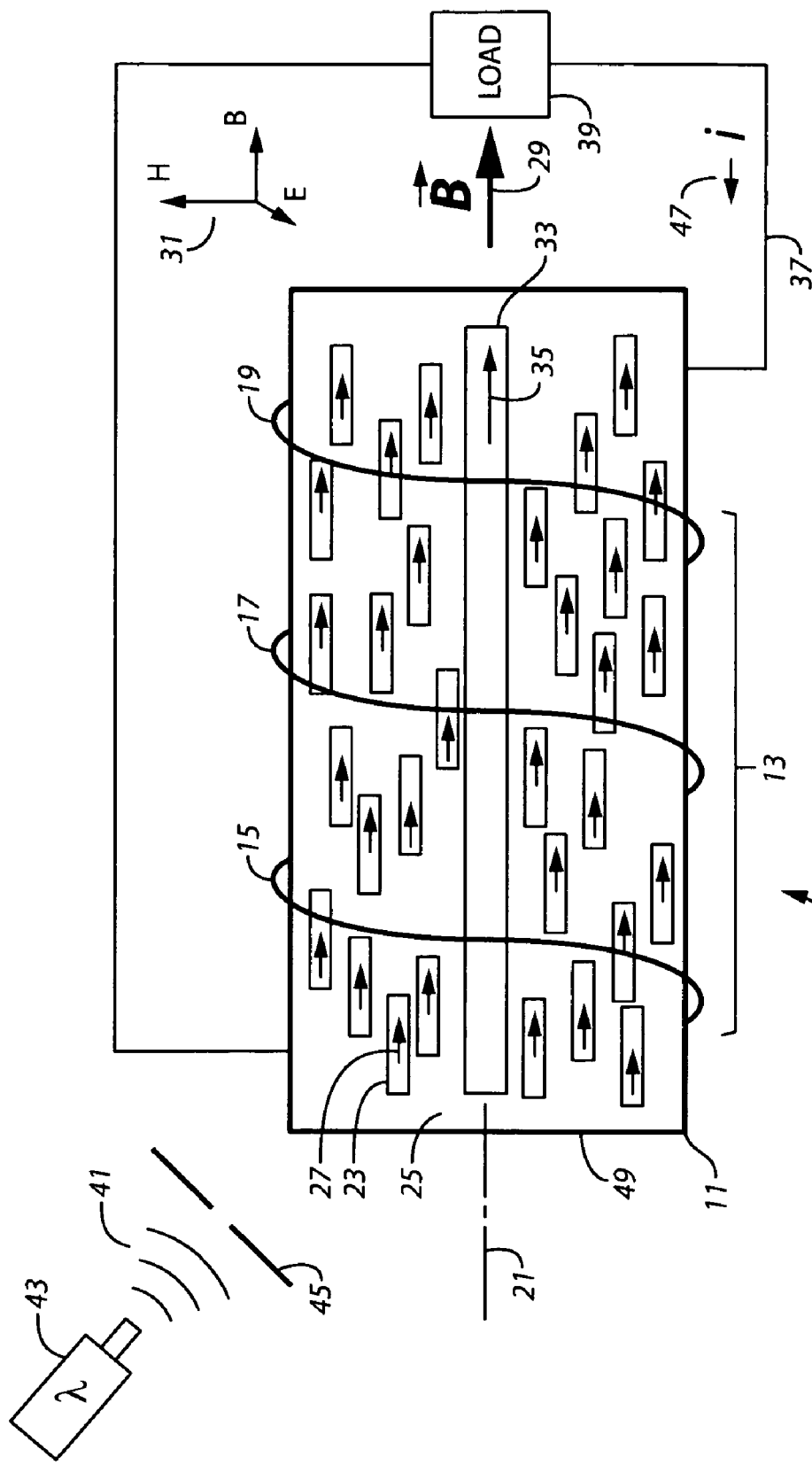
FIG. 1 is a diagrammatical representation of an energy conversion system, in accordance with the present invention, including a source of radiant energy irradiating a magnetic dipole module enclosed in an electrical coil which is connected to a load.
Figure 2:
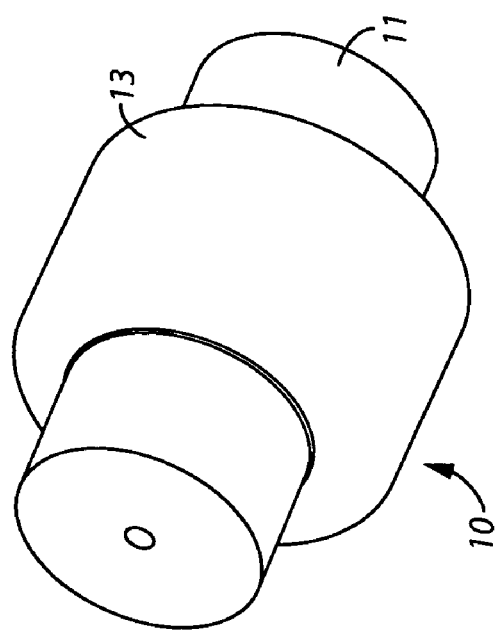
FIG. 2 is a perspective pictorial view of the magnetic dipole module and the electrical coil of FIG. 1.

Referring initially to FIGS. 1-2, an energy conversion device, shown generally as reference numeral 10, includes a magnetic dipole module 11 enclosed by an electrical coil 13 having a plurality of 'N' turns or windings. The electrical coil 13 is thus immersed in a magnetic field produced by the magnetic dipole module 11. For clarity of illustration, only a first turn 15, a second turn 17, and a third turn 19 are shown in the diagrammatical representation of FIG. 1, but it should be understood that the number of turns or windings is much greater than three turns.

The magnetic dipole module 11 may be generally cylindrical in shape having a module longitudinal axis 21 and comprising a plurality of ferromagnetic nanocrystals 23 distributed within a matrix 25. The ferromagnetic nanocrystals 23 are preferably single-domain particles or smaller, and each ferromagnetic nanocrystal 23 comprises a material having a Curie temperature denoted by $T_C$.

Each ferromagnetic nanocrystal 23 has an associated nanocrystal magnetic dipole moment 27 generally aligned along the module longitudinal axis 21. In this aligned configuration, each nanocrystal magnetic dipole moment 27 contributes to a module aggregate magnetic field 29, designated by the vector symbol $\vec{B}$ and defined in accordance with a vector coordinate system 31.

The magnetic dipole module 11 may also include a rod-shaped core magnet 33 having a core magnetic dipole moment 35 aligned along, and preferably coincident with, the longitudinal axis 21. This aligned configuration serves to ensure that the contribution of the core magnetic dipole moment 35 to the strength of the module aggregate magnetic field 29 is optimal.

The core magnet 33 may comprise a permanent magnet, for example, or an electromagnet to provide a greater core magnetic dipole moment 35 than may be possible with a permanent magnet of similar size. A stronger core magnetic dipole moment 35 can, in turn, increase the magnetic strength of the ferromagnetic nanocrystals 23 which can, accordingly, subject the turns or windings of the electrical coil 13 to a greater magnetic flux produced by the magnetic dipole module 11.

Because of extremely small physical size, the ferromagnetic nanocrystals 23 may, under certain conditions, become superparamagnetic. The core magnet 33 serves to offset this potential occurrence by maintaining the magnetic moment orientation of the ferromagnetic nanocrystals 23 at temperatures below the Curie temperature until incident radiation decouples the magnetic moments.

The operation of the energy conversion device 10 follows from Faraday's observation that a transient electrical current can be induced in the electrical coil 13 if the magnetic field $\vec{B}$ is changed as a function of time. This changing magnetic field produces a corresponding change in the magnetic flux across the electrical coil 13. An electromotive force can be induced in an electrical circuit 37 comprising the electrical coil 13 and an external electrical load 39 in response to this change in the magnetic field $\vec{B}$. In accordance with Faraday's Law, the electromotive force is proportional to the time rate of change of the magnetic flux linking the electrical coil 13, $$E = -k\frac{dF}{dt}$$

where
- E is the electromotive force around the electrical coil 13;
- k is a constant of proportionality dependent on the choice of units for the electric and magnetic field quantities; and
- F is the magnetic flux linking the electrical circuit 37 which includes turns 15, 17, and 19.

The negative value of k indicates that the induced current (and accompanying magnetic flux) is in such a direction as to oppose the change of flux through the windings of the electrical coil 13 (exemplified by the turns 15, 17, and 19). As can be appreciated by one skilled in the relevant art, the resulting current can be increased by increasing the number of turns 'N' in the electrical coil 13.

In accordance with the present invention, the magnitude of the magnetic field $\vec{B}$ can decay and regenerate as a function of radiant energy incident on the energy conversion device 10. The radiant energy may be provided in the form of a radiation beam 41 emitted from a radiation source 43, as described in greater detail below.

The matrix 25 is highly transparent to the wavelength $\lambda$ of the radiation beam 41 such that the radiation source 43 transmits the radiation beam 41 through an enclosure 49 and through the matrix 25 with minimal attenuation to irradiate the ferromagnetic nanocrystals 23. Preferably, the wavelength $\lambda$ of the radiation beam 41 is also selected so as to effectively impart thermal energy to irradiated ferromagnetic nanocrystals 23. In an alternative embodiment, the enclosure 49 comprises a "soft" magnetic material.

At the start of operation, that is, before the radiation source 43 is powered to direct the radiation beam onto the magnetic dipole module 11, the ferromagnetic nanocrystals 23 are initially at an ambient temperature $T_a$, where $T_a$ is less than the Curie temperature $T_C$ of the ferromagnetic nanocrystals 23. When the energy conversion device 10 is irradiated by the radiation beam 41 for a predetermined amount of time, the ferromagnetic nanocrystals 23 are heated to a temperature of $T_1$ or greater, where $T_1$ is greater than the Curie temperature $T_C$.

As the respective temperatures of the ferromagnetic nanocrystals 23 rise above the Curie temperature $T_C$, the magnetic dipole moments 27 decouple out of alignment with the module longitudinal axis 21. The module magnetic field 29 begins to decay and may decrease to a value approximately that of the core magnetic dipole moment 35. This results in a decrease in magnetic flux across the electrical coil 13.

After a predetermined period of time, the irradiation of the magnetic dipole module 11 is reduced or terminated so as to allow heat to flow from the ferromagnetic nanocrystals 23 into the matrix 25. This action can be accomplished by, for example, attenuating the output of the radiation source 43 or by blocking the radiation beam 41. In one embodiment, the radiation source comprises a pulsed laser device (not shown) which functions to output a radiation beam 41, which controllably varies between full power and an attenuated power level.

In an alternative embodiment, the radiation beam can be blocked by closing a shutter 45, such as an optical Kerr cell or similar device, interposed between the radiation source 43 and the magnetic dipole module 11. As the nanocrystals 23 lose heat to the relatively cooler matrix 25, the temperatures of the nanocrystals 23 drop to a value of $T_2$ or lower, where $T_2$ lies below the Curie temperature. That is, $T_2 < T_C < T_1$. This drop in temperature allows the magnetic flux to regenerate and to reappear across the electrical coil 13.

Operation of the energy conversion device 10 thus comprises repetitive cycles of alternatingly causing the magnetic flux to decay across the electrical coil 13 and then enabling the magnetic flux to regenerate. These cycles of decay and regeneration are achieved by alternating the steps of: (1) irradiating the ferromagnetic nanocrystals 23 to a temperature of $T_1$ or higher to cause the magnetic flux to decay, and (2) reducing or terminating the irradiation for a predetermined amount of time to allow the temperatures of the ferromagnetic nanocrystals 23 to fall below $T_2$ so as to enable the magnetic flux to regenerate across the electrical coil 13.

In accordance with Faraday's Law, a corresponding electrical current i, indicated by an arrow 47, is produced in the electrical coil 13 with the decay and regeneration of the magnetic flux produced by the ferromagnetic nanocrystals 23. The high output frequency of the electrical current i, may be converted to a DC signal, and then to a lower-frequency AC signal, such as a 60 Hz output signal, for example. The energy conversion device 10 thus functions to directly convert a portion of the energy in the incident radiation beam 41 into the electrical current i provided to the external electrical load 39.

As understood by one skilled in the relevant art, a single domain may be approximately $10^{-6}$ to $10^{-2}$ cm$^3$ in size, for example, and may contain $10^{15}$ to $10^{21}$ atoms. The small physical sizes of the nanocrystals 23 thus allow the magnetic flux to be cycled at high frequencies. For example, single-domain particles having temperatures above the Curie temperature $T_C$ can be demagnetized in time intervals as small as one femtosecond. Changing the magnetic field at a high frequency can thus provide a relatively large electrical current even if the magnetic field is relatively small.

The radiation source 43 can be, for example, a narrowband source such as a laser, or a broadband source such as sunlight. The radiation beam 41 can thus comprise a range of frequencies best suited to induce heating of the ferromagnetic nanocrystals 23. As can be appreciated by one skilled in the art, the broadband sunlight source may be more practical than a narrowband laser source for providing, or boosting, an external electrical current source. In other applications, the best source to provide electricity, e.g., to a subcutaneous cardiac pacemaker or insulin pump, may be a pulsed radio-frequency source.

Figure 3:
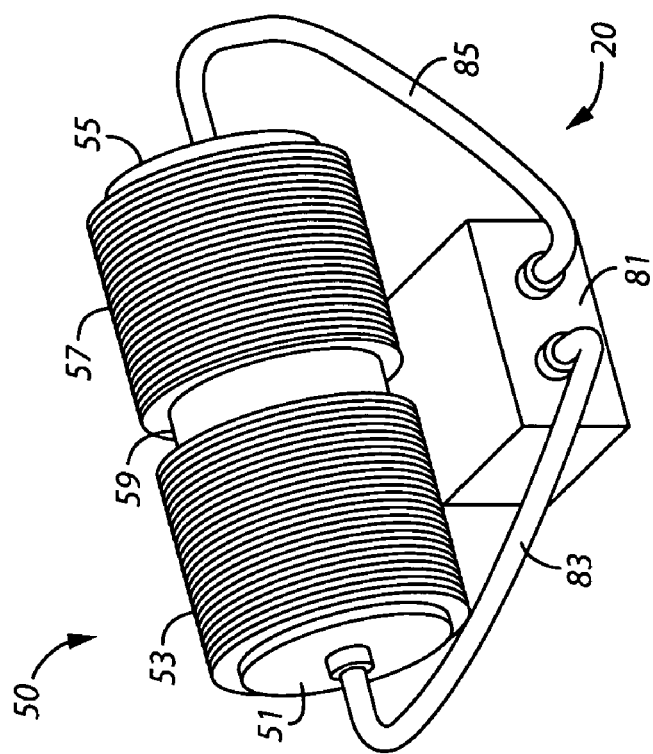
FIG. 3 is a perspective view of an energy conversion system having a radiant energy source transmitting radiant energy via optical fibers into two magnetic dipole modules, each magnetic dipole module enclosed in an electrical coil.
Figure 4:
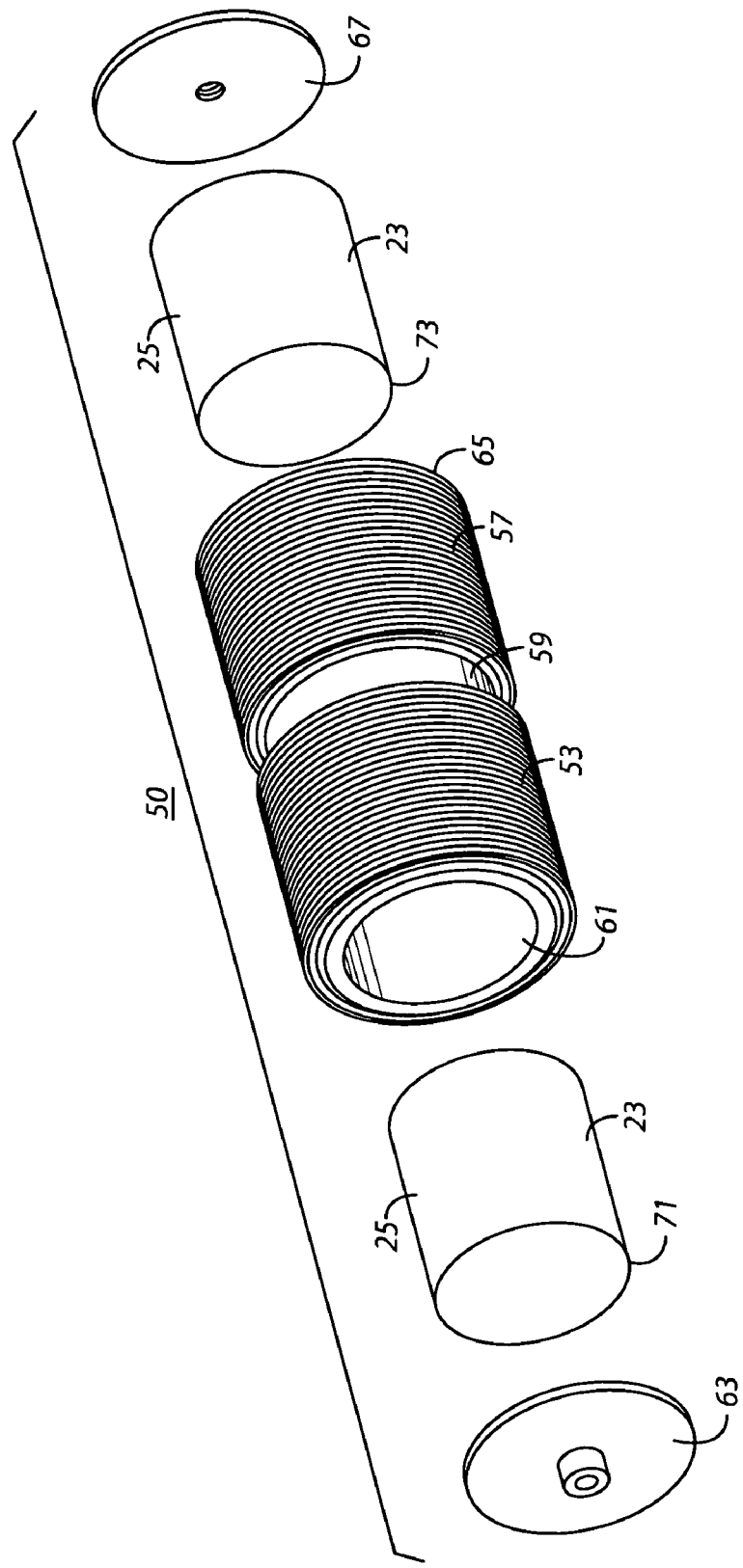
FIG. 4 is an exploded perspective pictorial view of a portion of the energy conversion device of FIG. 3 showing a ferromagnetic nanocrystal distribution provided as part of the magnetic dipole module of FIG. 3.

Referring now to FIGS. 3-4, an energy conversion device, shown generally as reference numeral 50, comprises a first ferromagnetic suspension chamber 51 at least partially enclosed in a first electrical coil 53, and a second ferromagnetic suspension chamber 55 at least partially enclosed in a second electrical coil 57. The energy conversion device 50 further includes a disk-shaped core magnet 59 disposed between the first ferromagnetic suspension chamber 51 and the second ferromagnetic suspension chamber 55.

The first ferromagnetic suspension chamber 51 includes a first cylindrical shell 61 and a first endcap 63, and the second ferromagnetic suspension chamber 55 includes a second cylindrical shell 65 and a second endcap 67. The first cylindrical shell 61, the first endcap 63, the second cylindrical shell 65, and the second endcap 67 can be fabricated from: (1) aluminum; (2) a nonmagnetic material or soft metal such does not hold a magnetic force when not in a magnetic field; or (3) a "soft" magnetic material. The first ferromagnetic suspension chamber 51 houses a first ferromagnetic suspension 71 comprising a distribution of the aligned ferromagnetic nanocrystals 23 in the matrix 25. Likewise, the second ferromagnetic suspension chamber 55 also houses a second ferromagnetic suspension 73 comprising a plurality of the ferromagnetic nanocrystals 23 disposed in the matrix 25.

Radiant energy is provided to the energy conversion device 50 by a radiation source 81, such as a pulsed laser source. When operating in accordance with the present invention, the radiation source 81 provides pulsed radiation (not shown) to the first ferromagnetic suspension 71 via a first optical fiber 83, and pulsed radiation to the second ferromagnetic suspension 73 via a second optical fiber 85. The energy conversion device 50, the radiation source 81, the first optical fiber 83, and second optical fiber 83 form an energy conversion system 20. The radiation pulses may be provided to the two ferromagnetic suspensions 71 and 73 either simultaneously or alternately.

Figure 5:
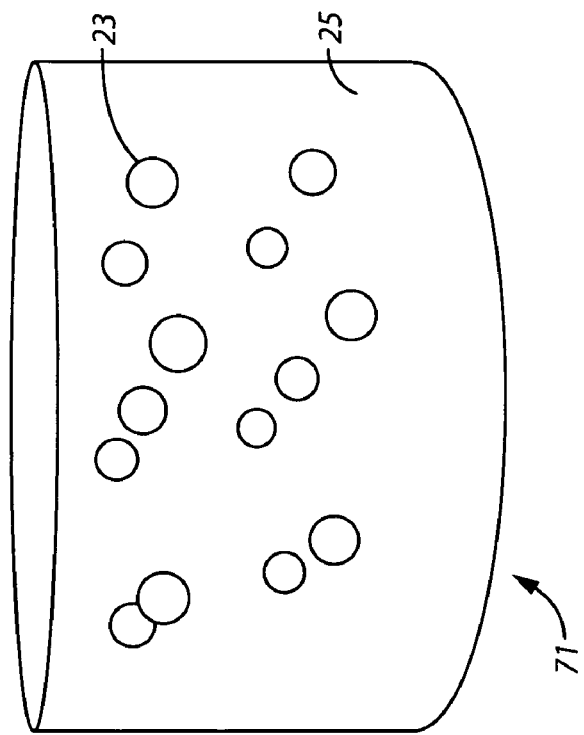
FIG. 5 is a pictorial view of a portion of the ferromagnetic nanocrystal distribution of FIG. 4.

Referring now to FIG. 5, in which the first ferromagnetic suspension 71 is shown in greater detail, the nanocrystals 23 comprise nickel having a Curie temperature of about 627° K., and the matrix 25 comprises aluminum oxide. In an alternative embodiment, the nanocrystals 23 comprise iron having a Curie temperature of about 1043° K. In other alternative embodiments, the nanocrystals 23 may be formed from: (1) "hard" ferromagnetic crystals comprising metal ions such as cobalt, neodymium, or gadolinium; (2) ferrite crystals comprising metal ions such as cobalt, neodymium, or gadolinium; or (3) ferrites such as yttrium-iron-garnet. When utilized in the first ferromagnetic suspension 71, a ferrite crystal may produce a weaker magnetic field than when utilizing a nanocrystal, but the frequency of operation may be greater than that for nonocrystals.

Figure 6:
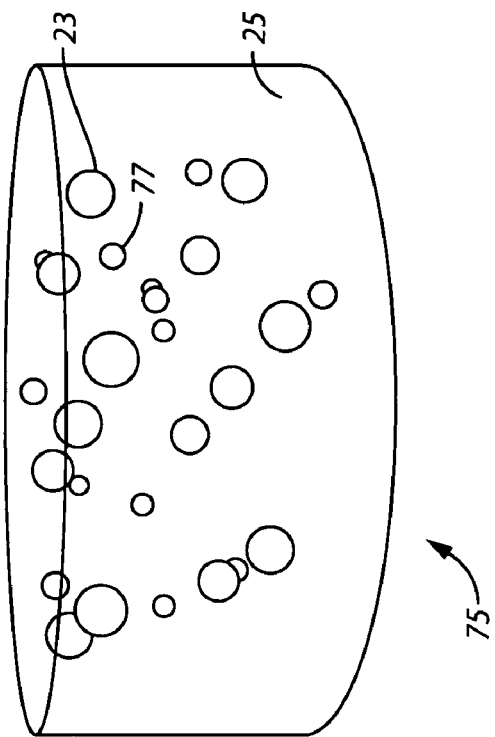
FIG. 6 is a pictorial view of a portion of an alternative ferromagnetic nanocrystal distribution of FIG. 4 including dopant elements.

Referring now to FIG. 6, a doped ferromagnetic suspension 75 is shown comprising a distribution of nanocrystals 23 in the matrix 25. The doped ferromagnetic suspension 75 further comprises a distribution of dopant particles 77 comprised of a material such as titanium, copper, yttrium, or other such transition metal. The dopant particles 77 may serve to scatter the radiation from the radiation source 81 throughout the first ferromagnetic suspension chamber 51 or the second ferromagnetic suspension chamber 55. In addition, as titanium has a relatively high thermal conductivity, the dopant particles would also serve to absorb heat from the nanocrystals 23. In yet another alternative embodiment, the dopant particles 77 comprise a material such as Ti:Sapphire-titanium-doped sapphire ($Ti^{3+}:Al_2O_3$).

Figure 7:
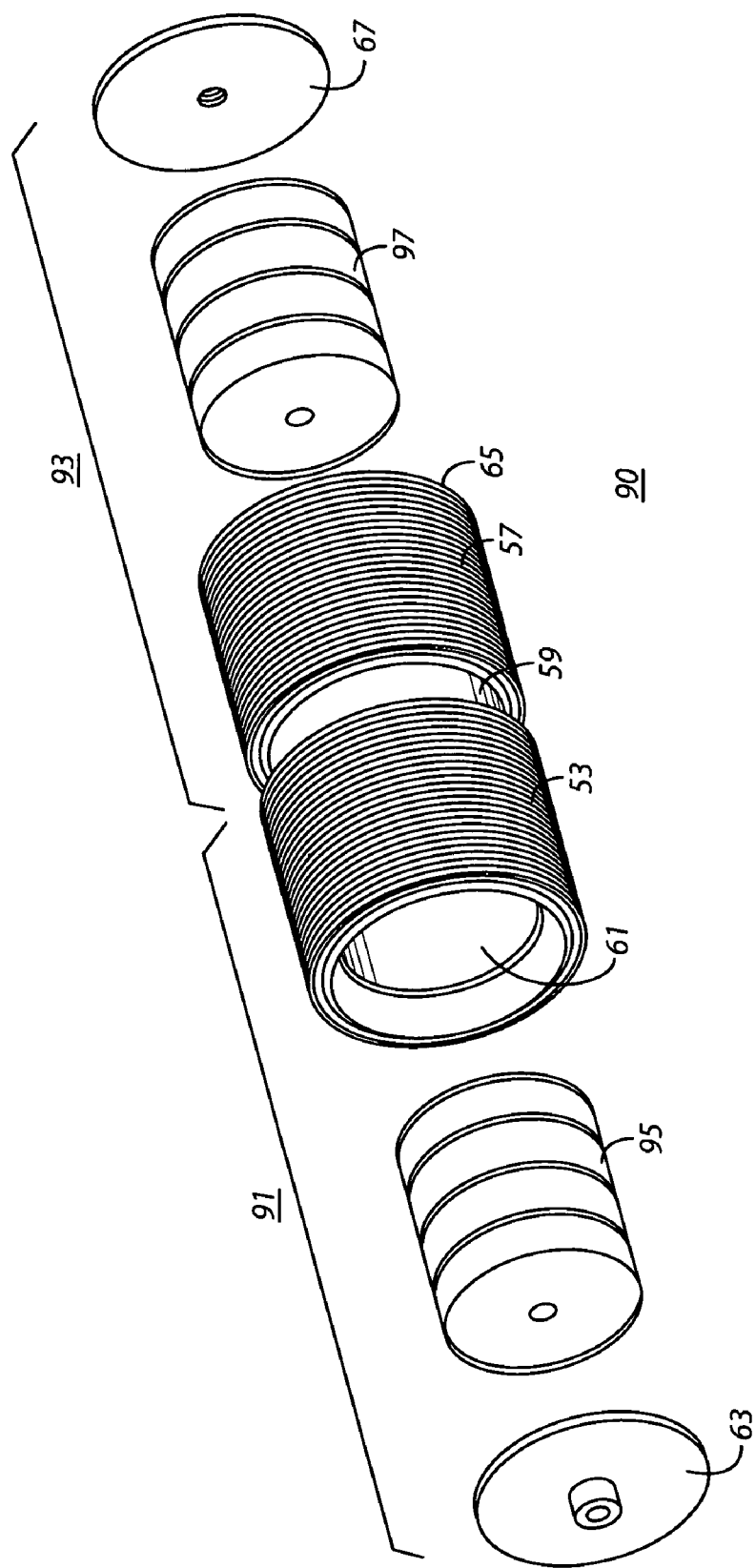
FIG. 7 is an exploded perspective pictorial view of an alternative embodiment of the energy conversion device of FIG. 4 showing a ferromagnetic stackup provided as part of the magnetic dipole module.

Referring now to FIG. 7, an energy conversion device, shown generally as reference numeral 90, comprises a first layered ferromagnetic chamber 91 at least partially enclosed in the first electrical coil 53, and a second layered ferromagnetic chamber 93 at least partially enclosed in the second electrical coil 57. In an alternative embodiment, the energy conversion device 90 may include the disk-shaped core magnet 59 disposed between the first layered ferromagnetic chamber 91 and the second layered ferromagnetic chamber 93.

Figure 8:
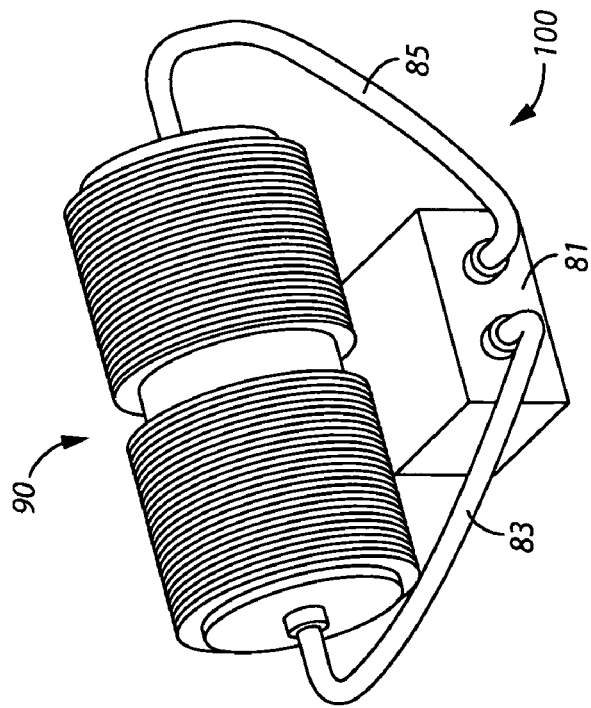
FIG. 8 is an alternative embodiment of the energy conversion system of FIG. 3 including the energy conversion device of FIG. 7.

The first layered ferromagnetic chamber 91 includes the first cylindrical shell 61, a first layered ferromagnet 95, and the first endcap 63. The second layered ferromagnetic chamber 93 includes the second cylindrical shell 65, a second layered ferromagnet 97, and the second endcap 67. The energy conversion device 90 can be used with the radiation source 81, the first optical fiber 83, and the second optical fiber 85 to form an energy conversion system 100, shown in FIG. 8. In an alternative embodiment, the energy conversion system 100 may comprise the first layered ferromagnetic chamber 91, the first electrical coil 53, the first optical fiber 83, and the radiation source 81.

Figure 9:
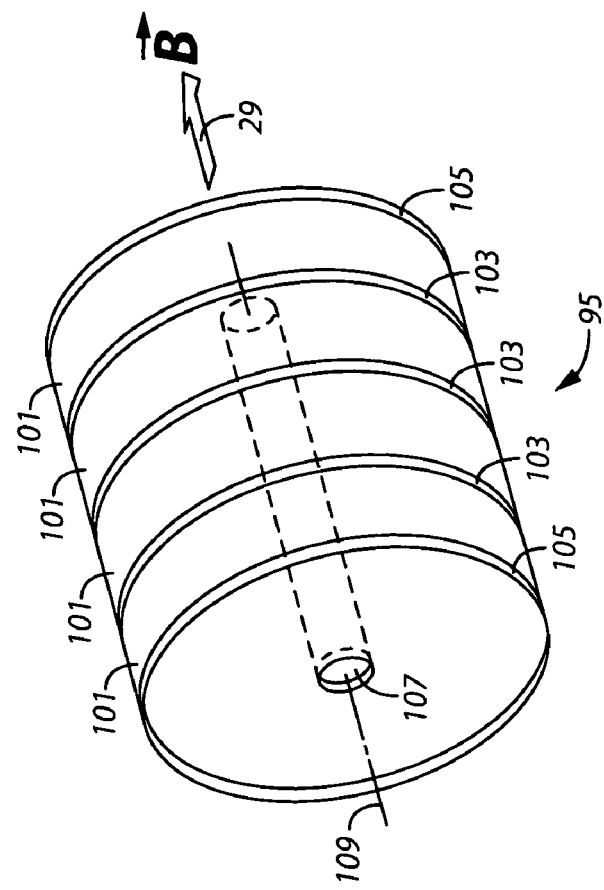
FIG. 9 is a pictorial perspective view of the magnetic dipole module of FIG. 7.
Figure 10:
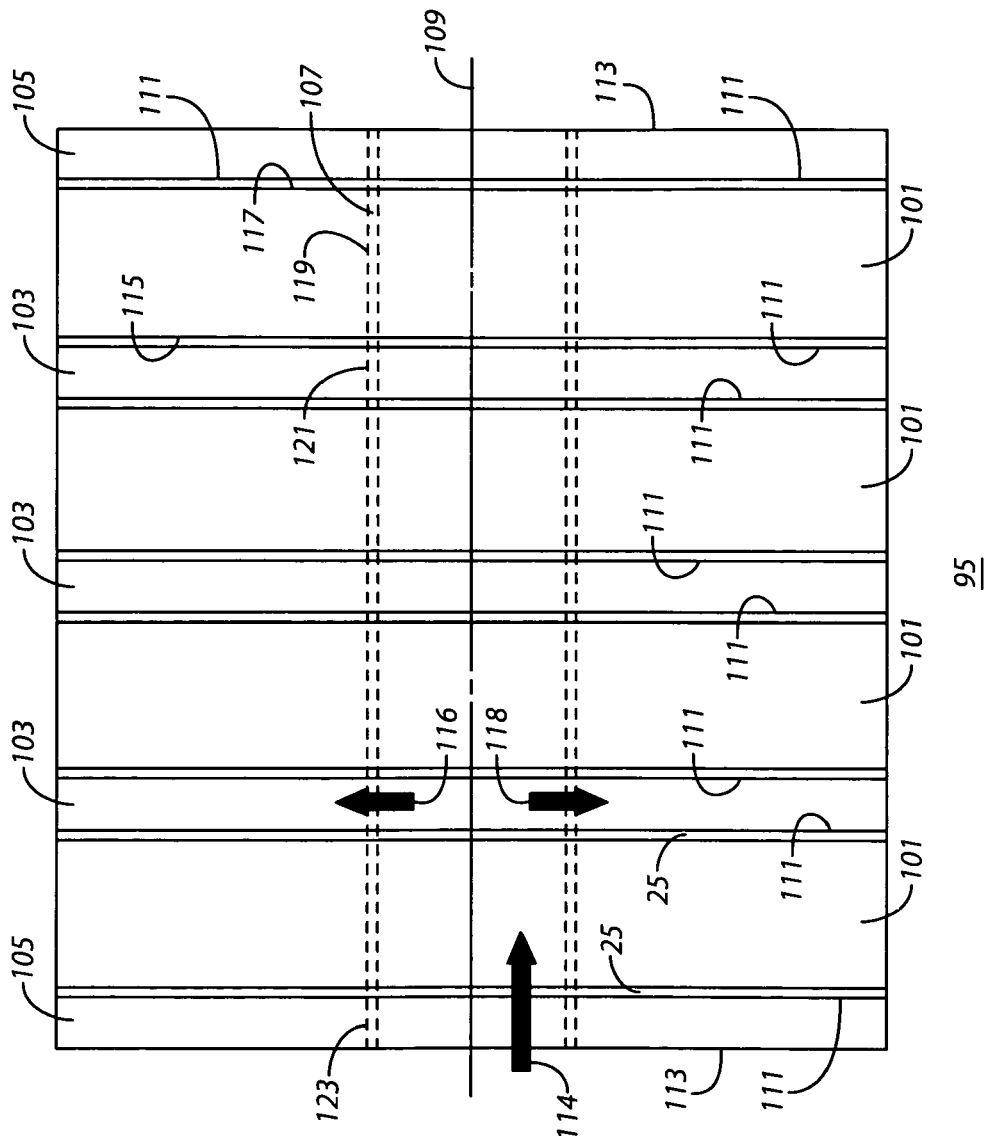
FIG. 10 is a side pictorial view of the magnetic dipole module of FIG. 9.

Referring now to FIGS. 9-10, the first layered ferromagnet 95 comprises a plurality of "soft" ferromagnetic annular disks 101 alternately stacked with a plurality of inner Ti:Sapphire annular disks 103. An outer Ti:Sapphire annular disk 105 is provided at both ends of the first layered ferromagnet 95. The outer Ti:Sapphire annular disk 105 may also include a coating 113 which is highly reflective to the wavelength λ of the radiation beam 41. The configuration of the second layered ferromagnet 97 is similar to that of the first layered ferromagnet 95.

For clarity of illustration, the perspective view of FIG. 9 shows a stack of four soft ferromagnetic annular disks 101 and three inner Ti:Sapphire annular disks 103 but it should be understood that fewer or more soft ferromagnetic annular disks 101 and Ti:Sapphire annular disks 103 can be used in the first layered ferromagnet 95 and in the second layered ferromagnet 97.

The first layered ferromagnet 95 also includes a cylindrical Ti:Sapphire core 107 extending through the inside of the stack comprising the soft ferromagnetic annular disks 101, the inner Ti:Sapphire annular disks 103, and the outer Ti:Sapphire annular disks 105. Preferably, the Ti:Sapphire core 107 is disposed along a layered ferromagnet axis 109 of the first layered ferromagnet 95.

Each of the soft ferromagnetic annular disks 101 includes a ferromagnetic nanocrystal coating 111 on a first disk face 115 and on a second disk face 117, as best seen in FIG. 10. Each soft ferromagnetic annular disk 101 also includes a central opening 119, each inner Ti:Sapphire annular disks 103 includes a central opening 121, and each outer Ti:Sapphire annular disk 105 includes a central opening 123. Each of the central openings 119, the central openings 121, and the central openings 123 is preferably sized to allow insertion of the Ti:Sapphire core 107. This configuration provides for the placement of the cylindrical Ti:Sapphire core 107 into the stack comprising the soft ferromagnetic annular disks 101, the inner Ti:Sapphire annular disks 103, and the outer Ti:Sapphire annular disks 105 as shown.

The ferromagnetic nanocrystal coating 111 comprises a layer of the matrix 25 having embedded therein a plurality of "hard" ferromagnetic nanocrystals 23 (not shown) with respective nanocrystal magnetic dipole moments (not shown) aligned with the layered ferromagnet axis 109. The soft ferromagnetic annular disks 101 comprise a magnetic material having a Curie temperature $T_{Csoft}$ where $T_{Csoft} > T_C$, the Curie temperature of the ferromagnetic nanocrystals 23. The ferromagnetic nanocrystals 23 may comprise nickel or iron, as described above, or may comprise iron-nickel-titanium alloy particles of sufficiently large size that the ferromagnetic nanocrystals 23 are not superparamagnetic. The magnetic dipole moments 27 produce the module aggregate magnetic field 29, shown in FIG. 9.

Operation of the energy conversion system 100 includes irradiating the first layered ferromagnet 95 and the second layered ferromagnet 97 with the radiation beam 41, as described above for the energy conversion system 20. The radiation beam 41 is transmitted to the first layered ferromagnet 95, for example, via the first optical fiber 83. From the first optical fiber 83, the radiation beam 41 is directed into the Ti:Sapphire core 107, as indicated by arrow 114. As the Ti:Sapphire core 107 is transparent to the radiation beam 41, the radiation beam 41 is internally scattered into the plurality of inner Ti:Sapphire annular disks 103, such as indicated by arrows 116 and 118, and into the two outer Ti:Sapphire annular disks 105.

The scattered radiation beam 41 irradiates the ferromagnetic nanocrystals 23 embedded in the plurality of ferromagnetic nanocrystal coatings 111 on the soft ferromagnetic disks 101. The nanocrystal magnetic dipole moments 27 are uncoupled by the incident radiation and begin to decay. This action causes the soft ferromagnetic annular disks 101 to demagnetize, causes the module aggregate magnetic field 29 to collapse, and results in the generation of an electrical current in the first electrical coil 53 as described in greater detail above.

In an alternative embodiment, discs comprising yttrium aluminum garnet (YAG) are used in place of the Ti:Sapphire annular disks 103 and 105, and a core comprising yttrium aluminum garnet is used in place of the Ti:Sapphire core 107. Additionally, the yttrium aluminum garnet discs comprise coatings of yttrium-iron-garnet (YIG) nanocrystal particles.

Since many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalence.

What is claimed is:

1. A system for generating electricity, said system comprising:
   a magnetic dipole module having a plurality of single-domain magnetic particles disposed in a matrix; and
   a source of radiant energy for irradiating said magnetic dipole module, wherein said source of radiant energy comprises a laser;
   an electrical coil enclosing at least a portion of said magnetic dipole module.

2. A system as recited in claim 1 further comprising a shutter disposed between said source of radiant energy and said magnetic dipole module.

3. A system as recited in claim 1 further comprising an optical fiber having a first end attached to said source of radiant energy and a second end attached to said magnetic dipole module.

* * * * *